United States Patent [19]
Mitchell, Jr. et al.

[11] 3,894,872
[45] July 15, 1975

[54] TECHNIQUE FOR FABRICATING HIGH Q MIM CAPACITORS

[75] Inventors: Joseph Mitchell, Jr., Kinnelon; Lester Andrew Carr, Jr., Trenton, both of N.J.

[73] Assignee: RCA Corporation, New York, N.Y.

[22] Filed: July 17, 1974

[21] Appl. No.: 489,456

[52] U.S. Cl. .................... 96/36; 317/258; 29/25.42; 264/129; 156/17
[51] Int. Cl. ... C23c 11/00; H01g 1/00; H01g 13/00
[58] Field of Search ..................... 317/258; 117/212; 29/25.42; 156/17

[56] References Cited

UNITED STATES PATENTS 3,231,421 1/1966 Schmidt .............................. 117/217
3,274,025 10/1966 Ostis .................................... 117/217
3,385,729 5/1968 Torchian ............................. 117/217

*Primary Examiner*—John D. Welsh
*Attorney, Agent, or Firm*—Glenn H. Bruestle; William S. Hill

[57] ABSTRACT

A process for making an MIM (metal-insulator-metal) capacitor comprising thermally depositing or growing a dielectric on a silicon substrate, depositing an electrode on the dielectric, removing the silicon substrate, thereby exposing the dielectric, and depositing a second electrode on the exposed dielectric is disclosed.

13 Claims, 13 Drawing Figures

TECHNIQUE FOR FABRICATING HIGH Q MIM CAPACITORS

The invention herein described was made in the course of or under a contract with the Department of the Army.

FIELD OF THE INVENTION

The present invention relates to capacitors. More particularly, this invention relates to a method for producing capacitors with a dielectric which has been thermally deposited or grown on a silicon substrate wherein the silicon substrate is not retained as a part of the resulting capacitor.

BACKGROUND OF THE INVENTION

In microwave circuits there has been a need for capacitors of high Q, i.e., a low resistive component of the impedance, and of high capacity per unit area, which are capable of withstanding operating voltages without breakdown. This is not possible with conventional capacitors. For example, metal-ceramic-metal capacitors prepared by mechanical techniques have high losses at microwave frequency or a low capacitance density. MOM (metal-oxide-metal) capacitors prepared by conventional techniques have low losses at microwave frequencies but have a low capacitance density.

It has been known that it is possible to deposit layers of silicon dioxide and of silicon nitride on silicon. These layers have good dielectric strengths, low imperfection levels and desirable thicknesses. Such layers have previously been utilized for passivating bipolar transistors, as dielectrics in the gate electrodes of unipolar transistors, and as dielectrics in metal-oxide-silicon (MOS) capacitors. The losses in these MOS capacitors, however, are unacceptably high for many microwave circuits.

SUMMARY OF THE INVENTION

The present invention is a method for making a capacitor by thermally growing or decomposing a dielectric on a silicon substrate, depositing an electrode on the dielectric, removing the silicon substrate, thereby exposing the dielectric, and depositing a second electrode on the dielectric. The thickness of the dielectric layer is limited only by the dielectric strength of the material and the operating voltage to which the capacitor will be subjected to in use. Removal of the silicon substrate eliminates the losses found in MOS capacitors.

DESCRIPTION OF PREFERRED EMBODIMENTS

It will be understood that, in the description which follows, although the method is described in connection with making a single capacitor, a plurality of capacitors can be made simultaneously from a single silicon wafer.

Figure 1:
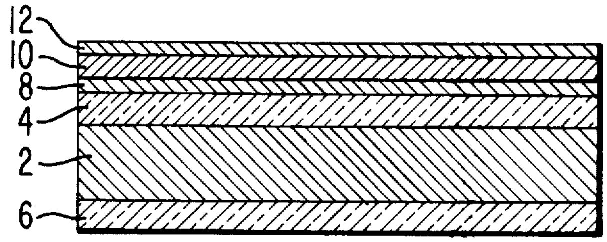
FIGS. 1–7 are cross sectional views illustrating successive steps in one embodiment of the present invention.

Referring now to FIG. 1, which illustrates one embodiment of the present invention, a polished single crystal silicon wafer 2 has silicon dioxide layers 4 and 6 thermally grown on its top and bottom surfaces, respectively, by a conventional steam oxidation method, e.g., wet thermal oxidation of the silicon substrate 2 at about 1200°C in a tube furnace for 45 minutes will grow a silicon dioxide layer about 8,000A. thick. The silicon in the silicon dioxide layers 4 and 6 is derived from the silicon of the silicon wafer 2. The thickness of the silicon dioxide layers 4 and 6 is controlled by varying the reaction time and temperature. The minimum thickness is limited by the dielectric strength of the material and by the operating voltages and capacitance required in a particular application.

To form the first electrode a layer of chromium 8, which may have a thickness of about 150 A. for example, is first deposited on the silicon dioxide layer 4 by a conventional method, e.g., evaporation or rf sputtering. Then a layer of copper 10, which may have a thickness of about 3000 A., is deposited on the chromium layer 8 by a similar method. The thickness of the copper layer 10 is then built up to about 3 mils (or any other desired thickness) by electroplating additional copper on the original deposit. A layer of gold 12, which may have a thickness of about 5,000 A., is deposited on the copper layer 10. Alternatively, any low loss conductive metal or metals, e.g., silver, copper, gold, or aluminum, compatible with the dielectric layer 4 can be deposited as the electrode. This can be followed by any other platable metal using metalization techniques well known in the art.

After depositing the first metal electrode, the silicon substrate 2 and the bottom layer of silicon dioxide 6 are removed. In preparation, the metal layer 12 is covered with a masking (not shown). The bottom layer 6 of silicon dioxide is removed by etching with a buffered HF solution in a known manner. The silicon substrate wafer 2 is removed by etching with a solution of concentrated nitric and concentrated hydrofluoric acids (20:1).

The following are two different procedures that may be used to complete the device.

In the first procedure, the layered article remaining after the above described etching treatments, is turned over (FIG. 2) so that the silicon dioxide layer 4 is now on top. With the metal layers 8, 10 and 12 covered with the masking layer (not shown), layers of chromium, copper and gold 14, 16, and 18 (FIG. 3), respectively, are successively deposited on the silicon dioxide layer 4 as described above to form the second electrode.

Figure 4:
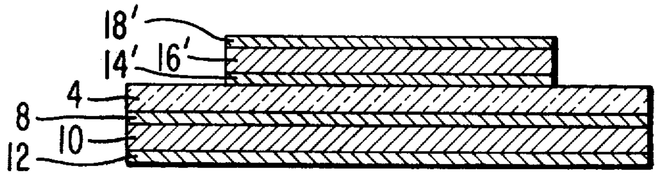

The next step is to define one of the electrode plates of the capacitor. This is done by covering the gold layer 18 with a photoresist (not shown) and, using conventional exposure and developing techniques partially exposing the surface of the gold layer 18, followed by etching away the metal layers 14, 16, and 18 in the exposed areas to leave smaller area metal layers 14′, 16′ and 18′ (FIG. 4). This composite metal layer becomes one electrode plate of the capacitor.

Figure 5:
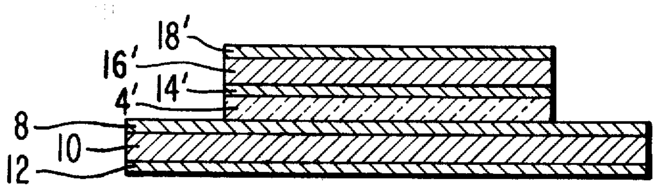
Figure 6:
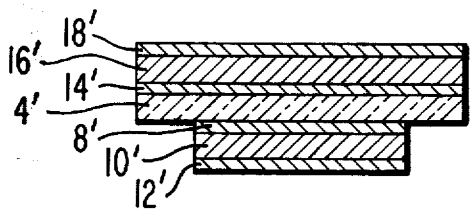
Figure 7:
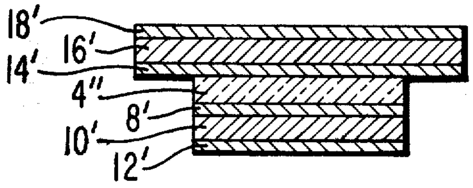

The edges of the silicon dioxide layer 4 not covered with the composite metal layer 14′, 16′ and 18′ are then removed with buffered HF, leaving the smaller layer 4′ (FIG. 5). The other electrode plate of the capacitor is then defined by masking and etching techniques as described above to leave a composite metal layer 8′, 10′ and 12′ (FIG. 6). The area of the composite metal plate constituting the second electrode of the capacitor may be smaller than that of the first electrode. It is generally preferred that the resulting overlapping part of the silicon dioxide layer 4' be retained to increase the insulating area and lessen the chance of shorting or current leakage. Alternately, the exposed part of the silicon dioxide 4' may be etched away leaving a silicon dioxide layer 4'' with an area corresponding to that of the smaller electrode (FIG. 7).

A second method of completing the capacitor will now be described.

Figure 2:
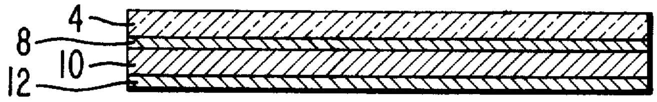
Figure 3:
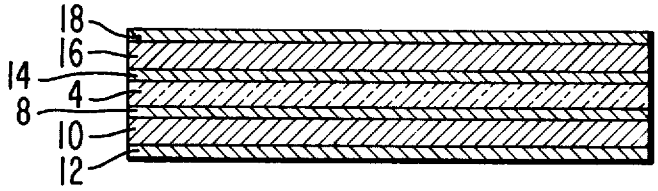

Referring now to FIG. 2, it is assumed that a partially completed article has been made comprising a layer of silicon dioxide 4 on a composite metal plate composed of layers 8, 10 and 12 of chromium, copper and gold, respectively.

Figure 8:
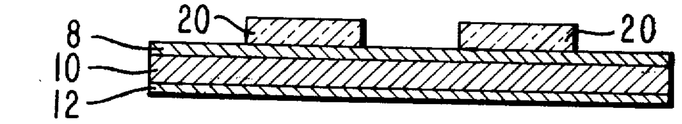
FIGS. 8–13 are similar views illustrating succesive steps in another embodiment of the present invention.
Figure 9:
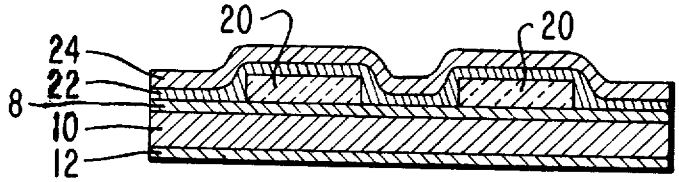

Using conventional masking and etching techniques, the silicon dioxide layer 4 is divided into a plurality of dielectric islands 20 (FIG. 8). The silicon dioxide islands 20 and the exposed surface of the chromium layer 8 are then covered, first, with a thin layer of chromium 22 and then with a layer of copper 24 (FIG. 9).

Figure 10:
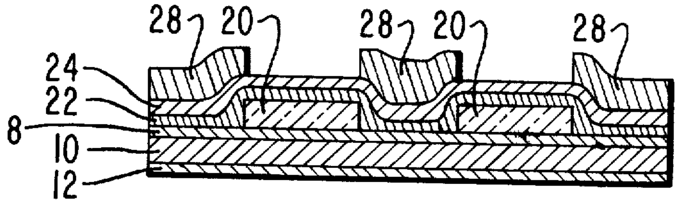

A layer of photoresist 28 is then deposited over the copper layer 24 and, by conventional exposure and developing techniques, portions of the copper layer 24 are revealed (FIG. 10).

Figure 11:
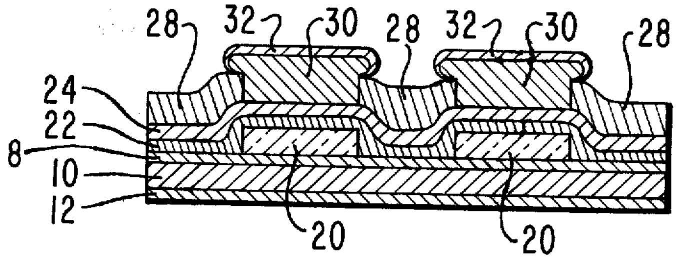

Thicker copper layers 30 are then deposited on the revealed copper layer 24 (FIG. 11) by electroplating. The thicker copper layers 30 may have a thickness of about 3 mils, for example. They serve as heat sinks in addition to serving as electrodes. The copper layers 30 are covered with a thin protective layer of a conductive metal 32, e.g., gold.

Figure 12:
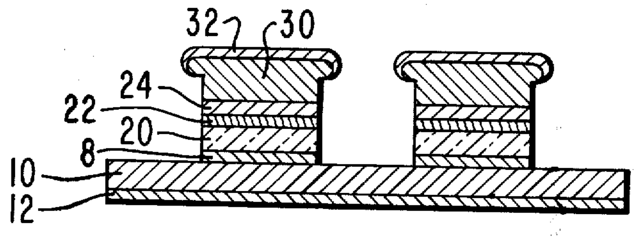

The remaining portions of the photoresist layer 28 are removed with a suitable solvent and the portions of the first copper layer 24 revealed by removing the photoresist portions 28 and the chromium layers 22 and 8 underlying the revealed copper layer 24 are etched away (FIG. 12).

Figure 13:
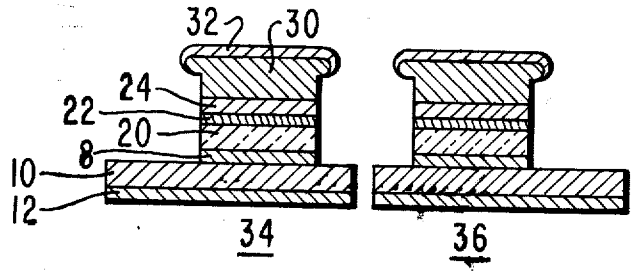

The final step is to separate the capacitors into separate units 34 and 36 by etching or sawing through that part of the copper layer 10 and gold layer 12 between the individual capacitors (FIG. 13). Hundreds of such capacitors can be made simultaneously from a single silicon wafer.

When silicon nitride is used as the dielectric, it may be deposited on the silicon substrate by chemical vapor deposition techniques, e.g., passing a mixture of silicon tetrachloride and ammonia over the substrate in a carrier gas and heating the silicon substrate to about 1000°C or passing a mixture of silane and ammonia over a silicon substrate heated to about 800°C. As in the embodiment utilizing silicon dioxide, successive layers of chromium, copper and gold are deposited on the silicon nitride dielectric layer as electrodes. Silicon nitride can be removed by etching with hydrofluoric acid.

When aluminum oxide is used as the dielectric, it may be deposited by sputtering and densifying at elevated temperatures, or by chemical vapor deposition techniques, e.g., pyrolysis of aluminum triisopropoxide on the silicon substrate at 450°C. Aluminum oxide can be removed by etching with concentrated hydrofluoric acid.

Capacitors made as hereinabove described can withstand voltages of at least 200 – 250 volts. They are especially useful in microwave circuits requiring high Q devices.

The use of a silicon substrate has proved particularly advantageous because it can be obtained in a state of very high purity and because its surface can be made very smooth and adherent to deposited dielectric films such as silicon dioxide, silicon nitride and aluminum oxide. Because of its high purity, impurities are much less likely to be introduced into the dielectric film. Thin films can be deposited having a high degree of perfection, resulting in the formation of capacitors having a high capacitance per unit area.

Silicon dioxide capacitors as prepared herein have a capacitance density up to about $10^5$ picofarads per square centimeter. In contrast, MOM silicon dioxide capacitors prepared by conventional techniques, generally have a capacitance density up to only about $10^4$ picofarads per square centimeter.

At 2 Giga Hertz a 50 picofarad silicon dioxide MIM capacitor, prepared by the present methods, had a resistance of about 0.15 ohms. At 1.4 Giga Hertz a 60 picofarad MOS capacitor had a resistance of about 1.2 ohms. The calculated resistance improvement attributed to replacing the lossy silicon of an MOS capacitor with a conductive metal, e.g, chromium, copper, silver, gold, or aluminum, is a reduction in resistance by a factor of about 10.

What is claimed is:

1. A method of making a capacitor comprising:
   a. thermally depositing or growing a layer of a dielectric on a silicon substrate;
   b. depositing a first electrode on the surface of said dielectric layer;
   c. removing said silicon substrate, thereby exposing said dielectric layer; and
   d. depositing a second electrode on said exposed dielectric layer.

2. A method according to claim 1 wherein said dielectric is thermally grown silicon dioxide.

3. A method according to claim 2 wherein said silicon dioxide is grown by steam oxidation of said silicon substrate.

4. A method according to claim 1 wherein said dielectric is silicon nitride.

5. A method according to claim 4 wherein said silicon nitride is deposited by passing a mixture of silicon tetrachloride and ammonia over said silicon substrate heated at a temperature of about 1000°C.

6. A method according to claim 4 wherein said silicon nitride is deposited by passing a mixture of silane and ammonia over said silicon substrate heated to about 800°C.

7. A method according to claim 1 wherein said dielectric is aluminum oxide.

8. A method according to claim 1 wherein said first and second electrodes are layers of a metal selected from the group consisting of chromium, copper, aluminum, gold and silver.

9. A method according to claim 1 wherein said first and second electrode comprise successive layers of chromium and copper.

10. A method according to claim 1 wherein said capacitor is completed by the steps of:
   a. masking one of said electrodes;
   b. covering the unmasked electrode with a photoresist;
   c. exposing and developing said photomask to reveal a desired pattern on said unmasked electrode;
   d. etching said revealed electrode; and
   e. removing said remaining photoresist and said mask.

11. A method according to claim 1 wherein a plurality of capacitors are made from said silicon substrate.

12. A method according to claim 11 wherein said capacitors are completed by the steps of:

a. separating said dielectric into islands on said first electrode;

b. depositing a layer of a conductive metal on said dielectric islands and said first electrode;

c. coating said metal layer with a photoresist;

d. exposing and developing said photoresist so as to reveal only portions of the surfaces of said metal layer disposed directly on said dielectric islands;

e. coating said revealed metal layer with a second layer of a conductive metal;

f. coating said second metal layer with a protective layer of a conductive metal;

g. removing the remaining photoresist; and h. etching away said first metal layer disposed directly beneath said remaining photoresist.

13. A method according to claim 12 wherein the resulting capacitors are separated.

* * * * *